(12) United States Patent
Fan et al.

(10) Patent No.: US 7,750,444 B2
(45) Date of Patent: Jul. 6, 2010

(54) LEAD-ON-CHIP SEMICONDUCTOR PACKAGE AND LEADFRAME FOR THE PACKAGE

(75) Inventors: Wen-Jeng Fan, Hsinchu (TW); Yu-Mei Hsu, Hsinchu (TW)

(73) Assignee: Powertech Technology Inc., Hsinchu (TW)

( * ) Notice: Subject to any disclaimer, the term of this patent is extended or adjusted under 35 U.S.C. 154(b) by 284 days.

(21) Appl. No.: 12/122,946

(22) Filed: May 19, 2008

(65) Prior Publication Data
US 2009/0283878 A1 Nov. 19, 2009

(51) Int. Cl.
*H01L 23/495* (2006.01)
(52) U.S. Cl. .................................... 257/670; 257/666
(58) Field of Classification Search ............... 257/666, 257/670
See application file for complete search history.

(56) References Cited
U.S. PATENT DOCUMENTS
6,265,762 B1 * 7/2001 Tanaka et al. ............... 257/676
6,603,195 B1 * 8/2003 Caletka et al. ............. 257/670

* cited by examiner

*Primary Examiner*—Thien F Tran
(74) *Attorney, Agent, or Firm*—Muncy, Geissler, Olds & Lowe, PLLC

(57) ABSTRACT

A LOC semiconductor package with the leadframe for the package is revealed. The LOC semiconductor package primarily comprises a plurality of leadframe's leads, at least a tie bar, a chip, and an encapsulant encapsulating the components mentioned above. Each lead has a bonding finger. The tie bar has a dummy finger where the dummy finger is linearly disposed at one side of the disposition area of the bonding fingers. The chip has an active surface with the bonding fingers. When the dummy finger and the bonding fingers are disposed above the active surface by a die-attaching layer, the dummy finger is adjacent to one edge of the active surface. The bonding fingers are electrically connected with the bonding pads. The dummy finger will bear the concentrated stresses to avoid the bonding fingers on the active surface to delamination or break due to external stresses and to avoid the interference to the layout of the leads.

20 Claims, 7 Drawing Sheets

LEAD-ON-CHIP SEMICONDUCTOR PACKAGE AND LEADFRAME FOR THE PACKAGE

FIELD OF THE INVENTION

The present invention relates to semiconductor devices, especially to Lead-On-Chip (LOC) semiconductor packages.

BACKGROUND OF THE INVENTION

Conventionally, a LOC (Lead-On-Chip) semiconductor package includes a semiconductor chip encapsulated by an encapsulant to prevent the contaminations of dust particles and moisture and a plurality of leads of a leadframe carrying the chip and transmitting the electrical signals of the chip to external electrical components. "Lead-On-Chip" means the leads of the leadframe are extended to the active surface of a chip with the chip attached to the leads of a leadframe to eliminate or minimize die pad(s). Since the CTE of the leadframe is different from the one of the chip, the thermal stresses induced by the thermal cycles during die-attaching processes and molding processes will be concentrated at certain leads, especially at the leads adjacent to the chip edges, leading to delamination or broken leads.

As shown in FIG. 1, a conventional LOC semiconductor package 100 comprises a plurality of leads 110 of a leadframe, a die-attaching layer 130, a chip 140, a plurality of bonding wires 150, and an encapsulant 160. As shown in FIG. 2, each lead 110 has a bonding finger 111. The leads 110 are arranged at two corresponding longer sides of a leadframe with a fan-in design toward the center of the packaging area to make the bonding fingers 111 in linear arrangements with fine pitches. As shown in FIG. 1 again, the chip 140 has an active surface 141 with a plurality of bonding pads 142 formed on the active surface 141 where the leads 110 are attached to the active surface 141 of the chip 140 by a die-attaching layer 130. The bonding wires 150 electrically connect the bonding pads 142 to the bonding fingers 111. The encapsulant 160 encapsulates parts of the leads 110 including the bonding fingers 111, the die-attaching layer 130, the chip 140, and the bonding wires 150. However, as shown in FIG. 2 and FIG. 3, several bonding fingers 111A located at two sides of the disposition area of the bonding fingers 111 will experience the largest stresses, leading to easy delamination between the bonding fingers 111A and the chip 140, or between the bonding fingers 111A and the encapsulant 160. Moreover, the delaminated bonding fingers 111A even contact with the adjacent bonding fingers 111 during molding processes leading to electrically short.

SUMMARY OF THE INVENTION

The main purpose of the present invention is to provide a LOC semiconductor package to reduce the stresses concentrated on some bonding fingers of the leads located at two corresponding far edges along the bonding fingers to eliminate the electrical short between the delaminated bonding fingers and the adjacent bonding fingers.

The second purpose of the present invention is to provide a LOC semiconductor package to dispose dummy finger without any electrical connections at two corresponding far edges along the bonding fingers to bear thermal stresses so that the electrical functions of the LOC semiconductor package will not be impacted even if the dummy finger are delaminated or even broken.

The third purpose of the present invention is to provide a LOC semiconductor package to enhance the stress resistance of the dummy finger.

The fourth purpose of the present invention is to provide a LOC semiconductor package to enhance the stress resistance of the bonding fingers adjacent to the dummy finger.

The fifth purpose of the present invention is to provide a LOC semiconductor package to avoid shifting or tilting of the unconstrained end of the mold-flow control plate during molding to balance the top and the bottom mold flows without connected to the leads.

The sixth purpose of the present invention is to provide a LOC semiconductor package to avoid the interference of the tie bar to the layout of the extended leads.

The seventh purpose of the present invention is to provide a LOC semiconductor package to increase the locking capability of the tie bar in an encapsulant.

According to the present invention, a LOC semiconductor package is revealed, primarily comprising a plurality of leadframe's leads, at least a tie bar, a die-attaching layer, a chip, a plurality of bonding wires, and an encapsulant. Therein, each lead has a bonding finger. The tie bar has a dummy finger disposed at one side of the disposition area of the bonding fingers, wherein the bonding fingers and the dummy finger are linearly arranged in parallel. The die-attaching layer connects the bonding fingers and the dummy finger. The chip has an active surface with a plurality of bonding pads disposed thereon. The die-attaching layer is attached to the active surface of the chip so that the bonding fingers and the dummy finger are located above the active surface with the dummy finger adjacent to a first edge of the active surface. The bonding wires electrically connect the bonding pads to the bonding fingers. The encapsulant encapsulates parts of the leads including the bonding fingers, the tie bar, the die-attaching layer, the chip, and the bonding wires. A leadframe for the semiconductor package mentioned above is also revealed in the present invention.

DETAIL DESCRIPTION OF THE INVENTION

Please refer to the attached drawings, the present invention will be described by means of embodiments below.

Figure 1:
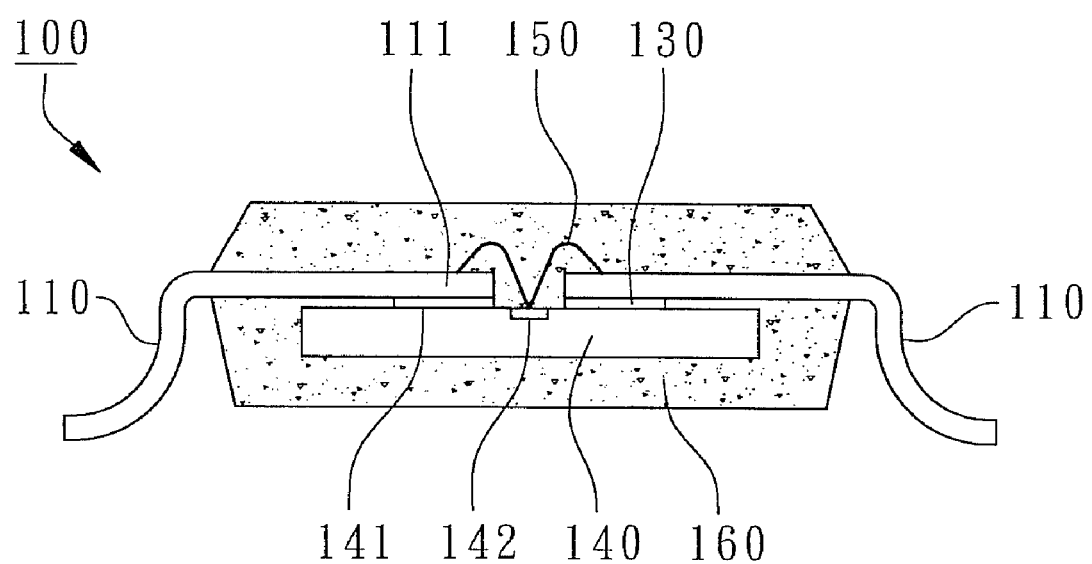
FIG. 1 shows a cross-sectional view of a conventional LOC semiconductor package along the center of a lead.
Figure 2:
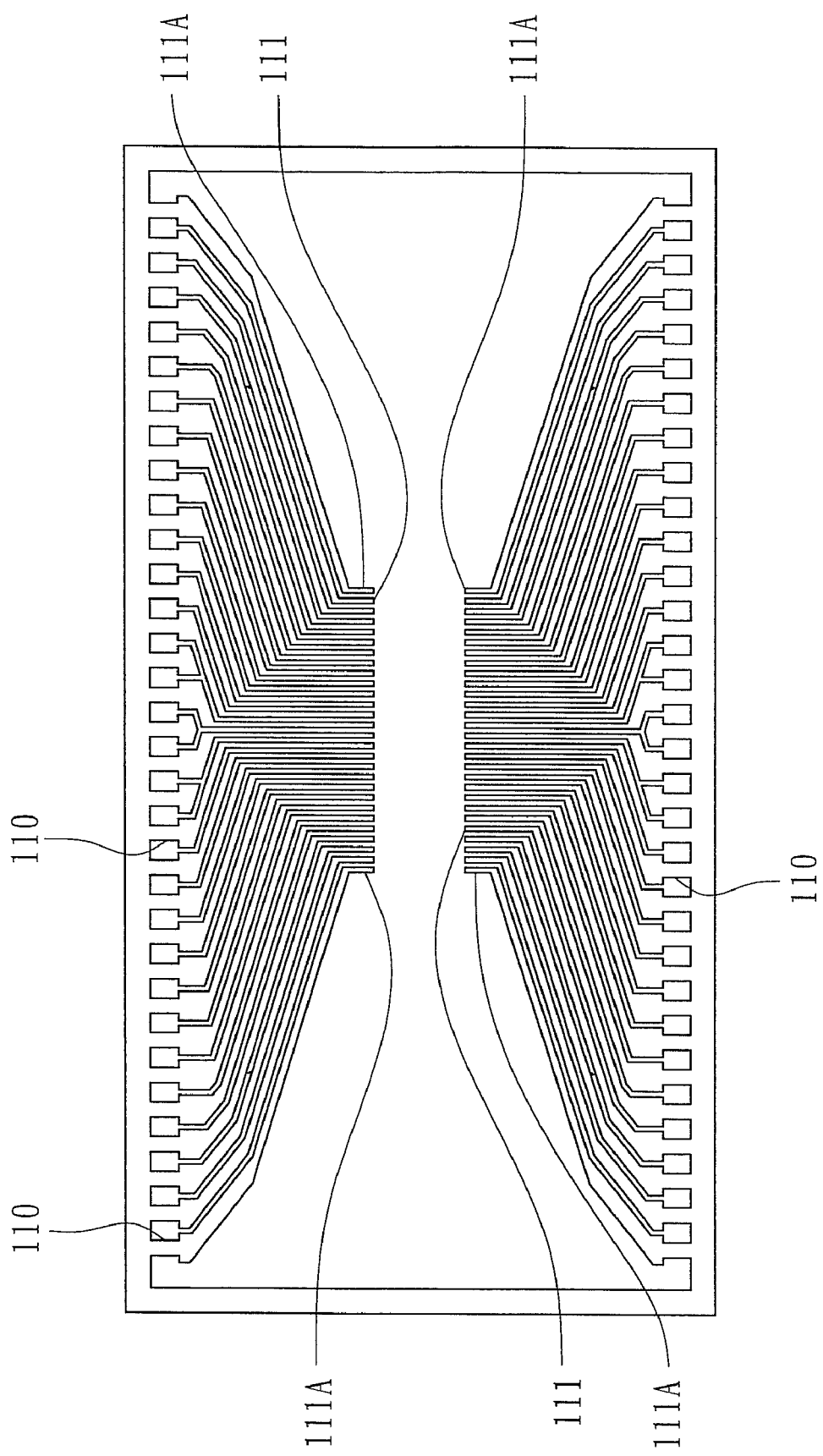
FIG. 2 shows a top view of a leadframe for the conventional LOC semiconductor package.
Figure 3:
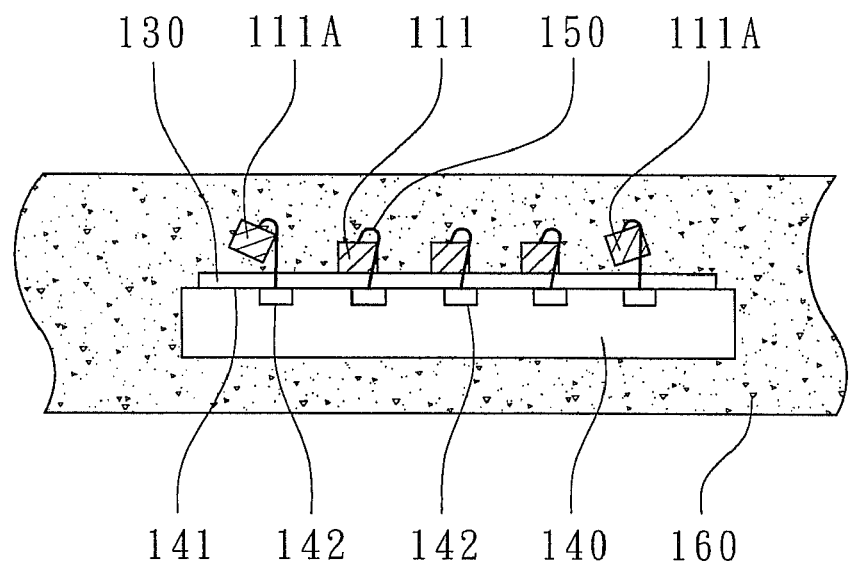
FIG. 3 shows a partial cross-sectional view of the conventional LOC semiconductor package perpendicular to the bonding fingers.
Figure 4:
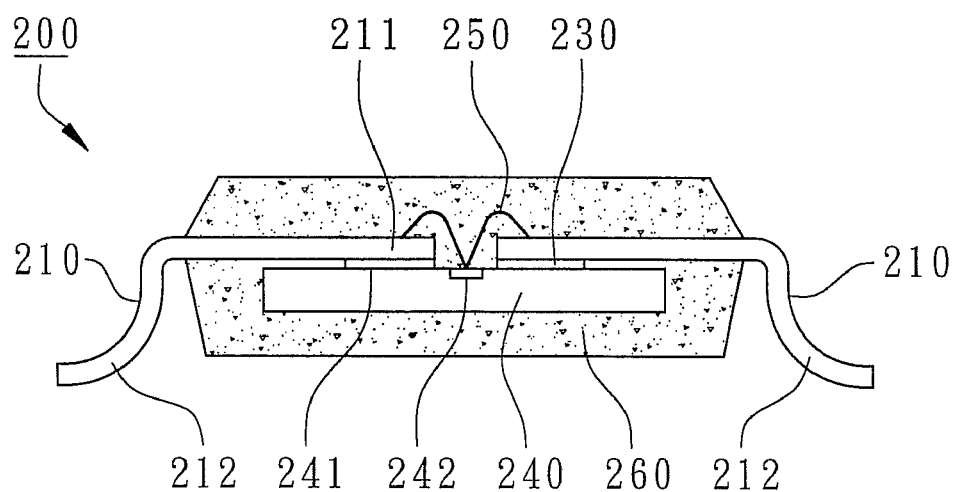
FIG. 4 shows a cross-sectional view of a LOC semiconductor package along the center of a lead according to the first embodiment of the present invention.
Figure 5:
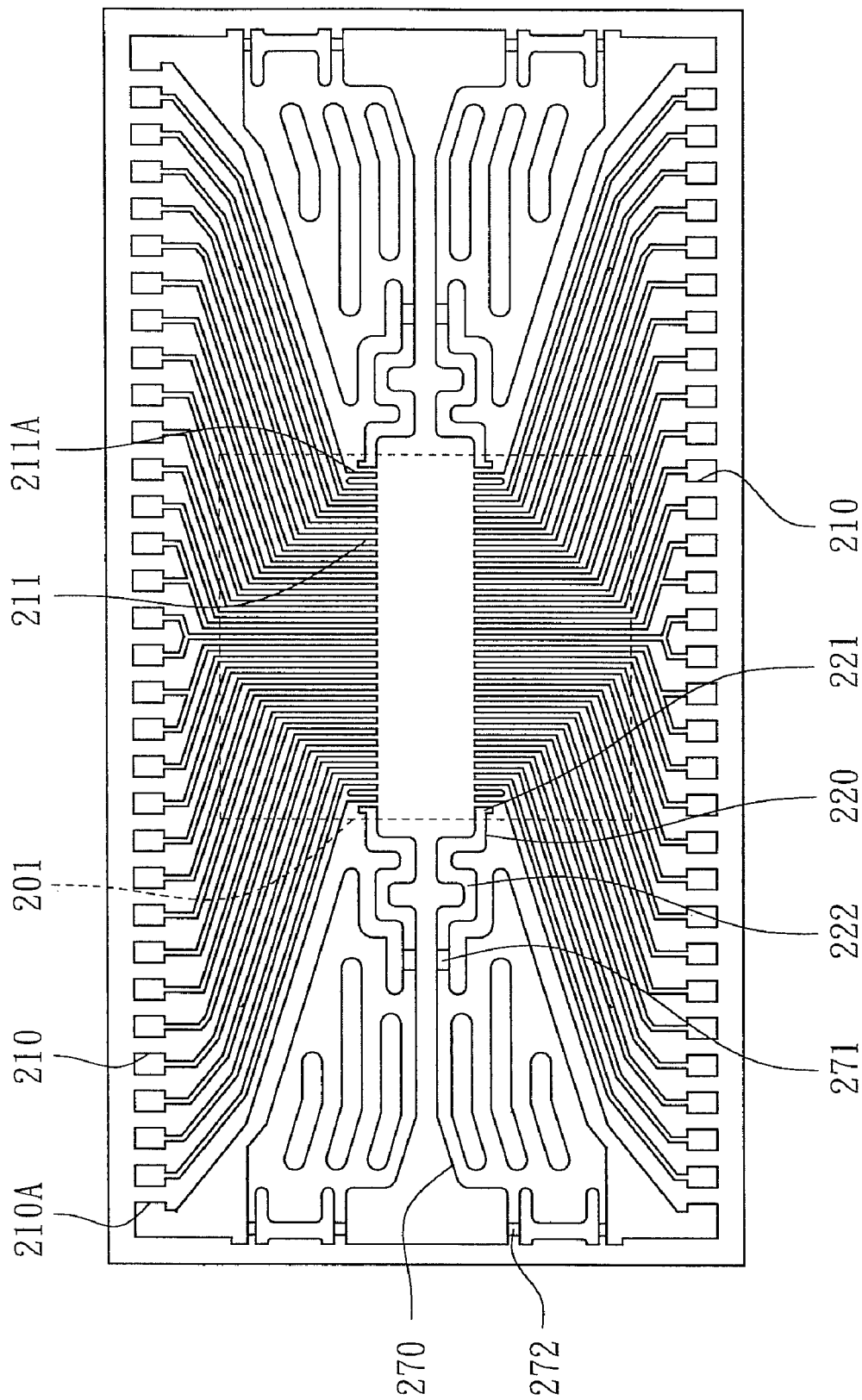
FIG. 5 shows a top view of a leadframe for the LOC semiconductor package according to the first embodiment of the present invention.

According to the first embodiment of the present invention, as shown in FIG. 4, a LOC semiconductor package 200 primarily comprises a plurality of leadframe's leads 210, at least a tie bar 220, a die-attaching layer 230, a chip 240, a plurality of bonding wires 250, and an encapsulant 260. As shown in FIG. 5, the leads 210 and the tie bar 220 are formed from the same metal leadframe with a thickness of about 0.2 mm to provide enough structural strength to support the chip 240. Each lead 210 has a bonding finger 211 at the internal end of the lead 210. As shown in FIG. 5 again, without limitations, the leads 210 can be arranged at two opposing longer sides of a leadframe in a packaging unit where the internal ends of the leads 210 are extended toward the center in a fan-in design through the encapsulation area of the encapsulant 260 and a die-attaching area 201 (the disposition area of the chip 240 on the leadframe). The dimension of the die-attaching area 201 is approximately equal to the dimension of the chip 240. Preferably, the internal portions of the leads 210 encapsulated by the encapsulant 260 are coplanar without any downsets to provide better structural strength to the chip 240.

Figure 6:
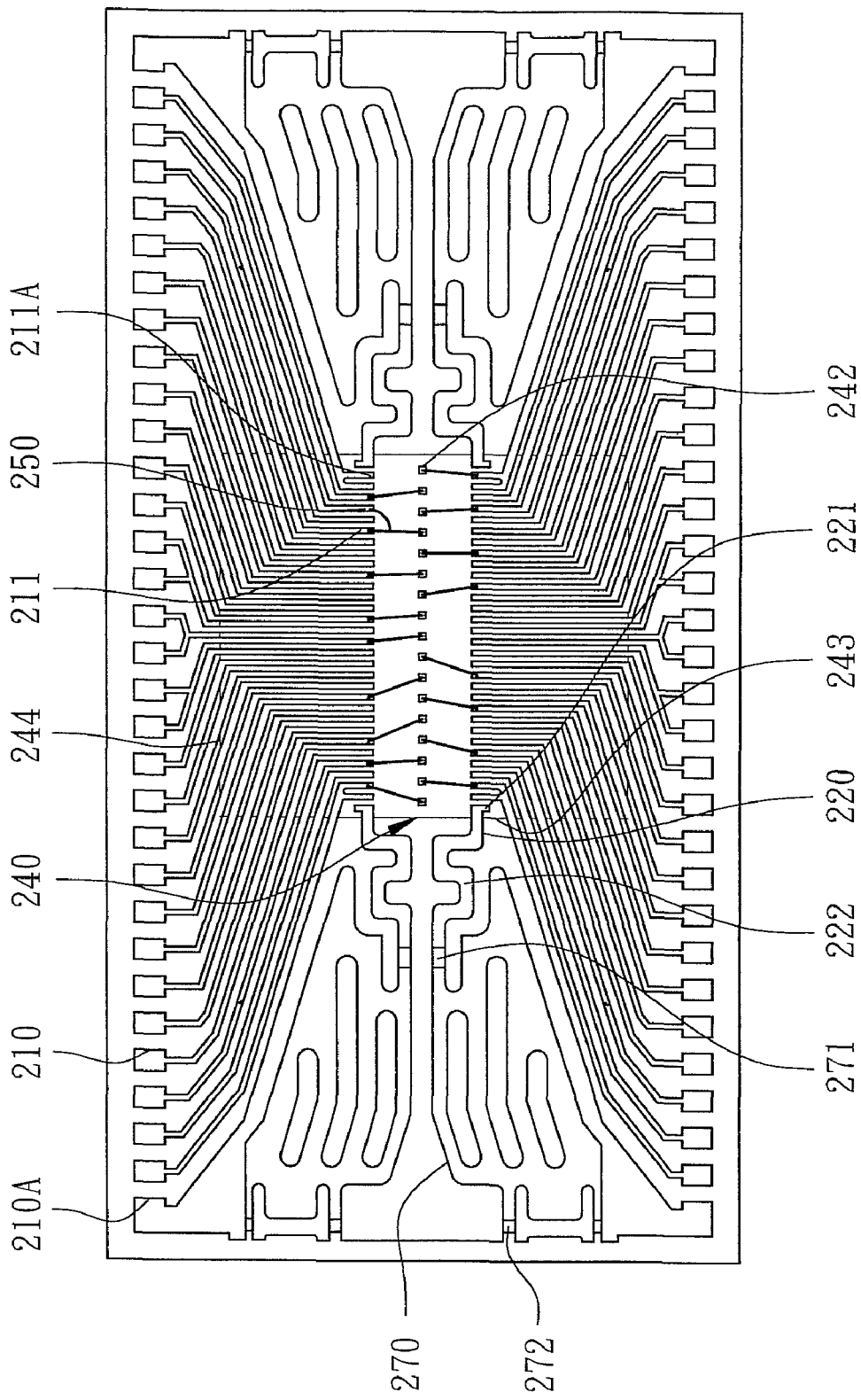
FIG. 6 shows a top view of the leadframe after die attaching and wire bonding processes of fabricating the LOC semiconductor package according to the first embodiment of the present invention.
Figure 7:
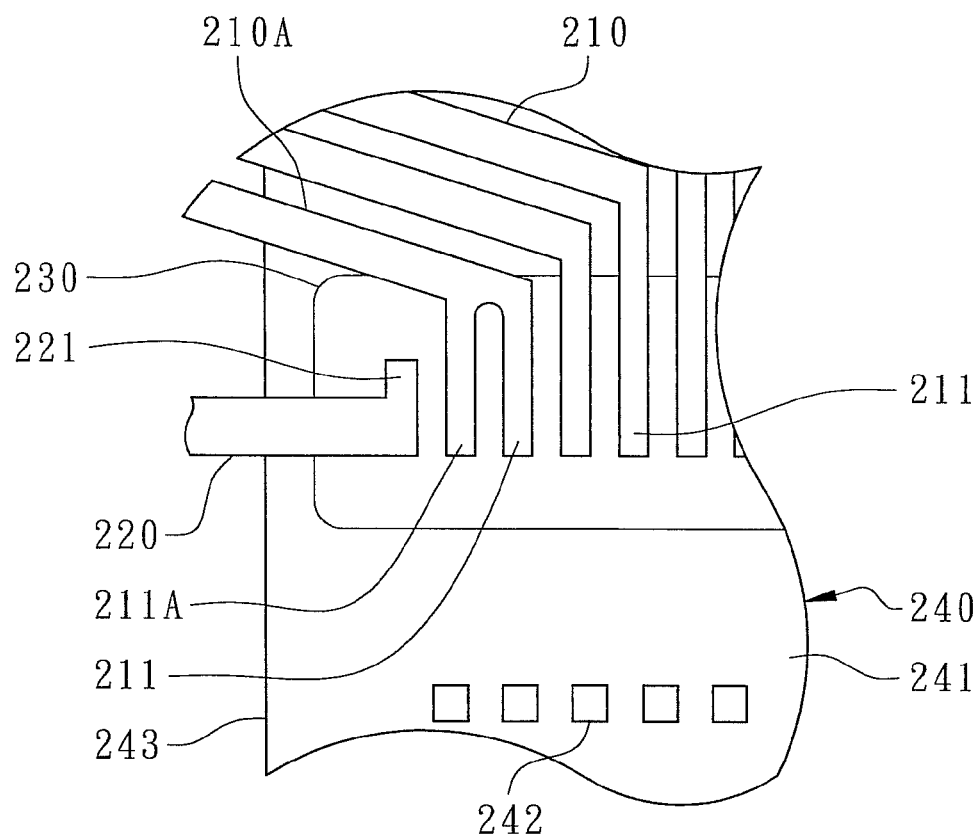
FIG. 7 shows a partially enlarged top view of the LOC semiconductor package before wire bonding processes according to the first embodiment of the present invention.
Figure 8:
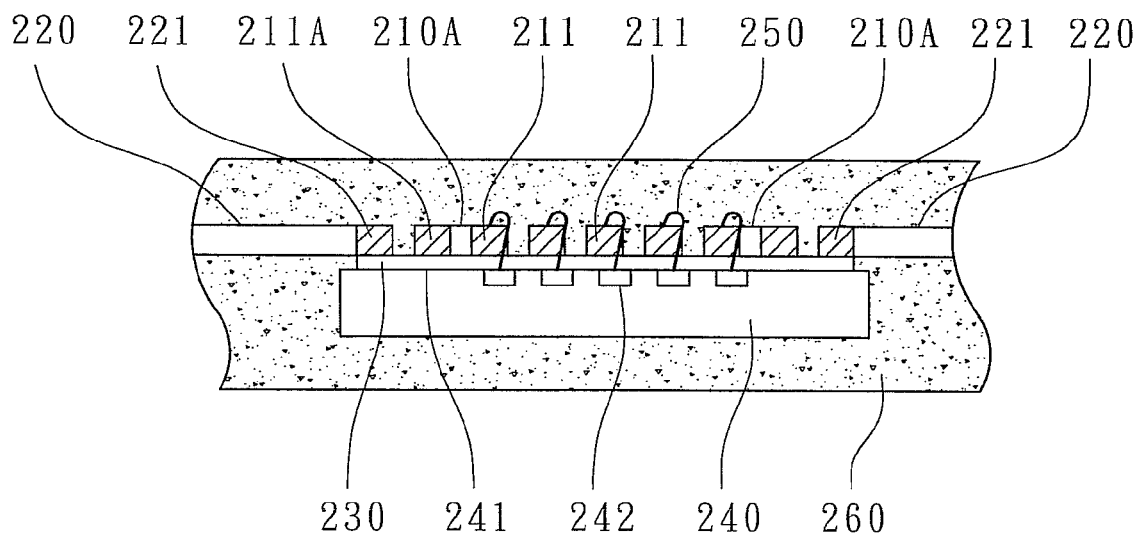
FIG. 8 shows a partial cross-sectional view of the LOC semiconductor package perpendicular to the bonding fingers according to the first embodiment of the present invention.

As shown in FIG. 5, FIG. 6, and FIG. 7, the tie bar 220 has a dummy finger 221 disposed at one side of the disposition area of the bonding fingers 211. Therein, the dummy finger 221 and the bonding fingers 211 are linearly arranged in parallel. The linearly arranging direction of the fingers 211 and 221 is parallel to the one of a plurality of bonding pads 242 of the chip 240, as shown in FIG. 6 and FIG. 7. As shown in FIG. 5, the bonding fingers 211 and the dummy finger 221 are located inside the die-attaching area 201. In other words, as shown in FIGS. 6 to 8, the bonding fingers 211 and the dummy finger 221 are located above the active surface 241 of the chip 240 when the leads 210 are attached to the chip 240 by the die-attaching layer 230. Therefore, the dummy finger 221 is disposed adjacent to one edge of the die-attaching area 201 where the stresses are most concentrated to bear the stresses exerted on the bonding fingers 211. The shape of the dummy finger 221 are similar to the one of the bonding finger 211 where the width of the dummy finger 221 can not be smaller than the one of the bonding finger 211. Since the dummy finger 221 are connected to the tie bar 220 and the bonding fingers 211 are connected to the leads 210, therefore, the dummy finger 221 is a fake bonding finger without any electrical functions just to bear stresses due to thermal cycles. In the present embodiment, the tie bar 220 does not extend outside the encapsulant 260 but each lead 210 has an external lead 212 extended outside the encapsulant 260. In this embodiment, there are four tie bars 220 arranged at two opposing shorter sides of a leadframe in a packaging unit and located in the encapsulation area of the encapsulant 260 where the internal ends of the tie bars 220 are extended toward the center through the die-attaching area 201 (the disposition area of the chip 240 on the leadframe). Accordingly, the dummy finger 221 imitates the bonding fingers 211 in shapes and disposition but has a different function and a different interconnection comparing with the bonding fingers 211.

As shown in FIG. 7, preferably, the leadframe further comprises a redundant finger 211A integrally connected with one of the bonding finger 211 adjacent to the dummy finger 221 through the same lead 210A. The redundant finger 211A is disposed between the connected bonding finger 211 and the dummy finger 221 to enhance the delamination resistance of the bonding fingers 211 of the leads 210 at two corresponding sides along the bonding fingers 211. Specifically, the redundant finger 211A and the connected bonding finger 211 are U-shaped connected. Furthermore, the external leads 212 are extended from two corresponding sides of the encapsulant 260 and are bent into appropriate shapes such as gull-leads, I-leads, or J-leads for external electrical connections as shown in FIG. 4.

Figure 9:
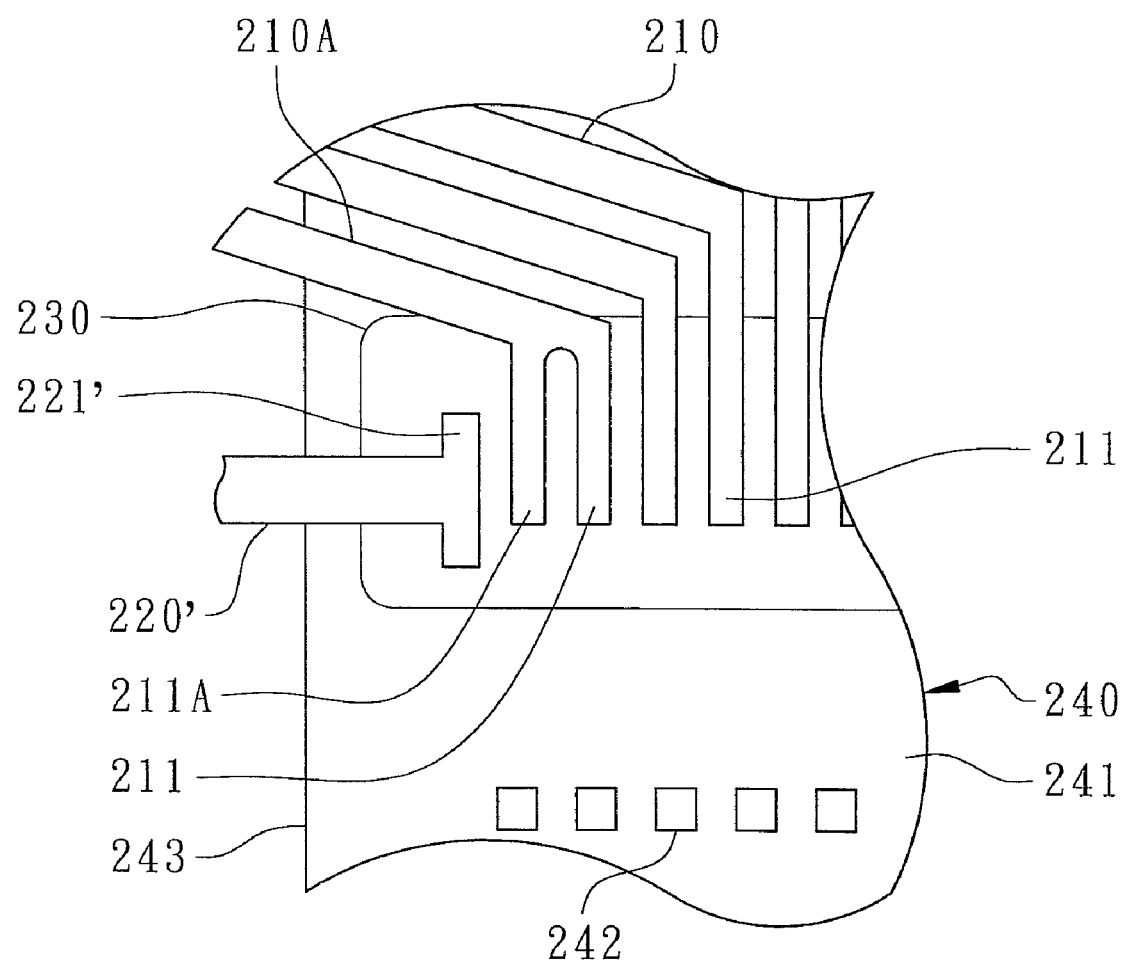
FIG. 9 shows a partially enlarged top view of another LOC semiconductor package before wire bonding processes according to the second embodiment of the present invention.

Preferably, as shown in FIG. 7, the tie bar 220 is L-shaped connected to an internal end of the dummy finger 221 to enhance the locking capability of the tie bar 220 in the encapsulant 260 (as shown in FIG. 8) without interfering the layout of the leads 210. The internal end is an end of a finger toward the bonding pads 242 of the chip 240. In another embodiment, as shown in FIG. 9, one tie bar 220' is T-shaped connected to the middle portion of another dummy finger 221' to enhance the locking capability of the tie bar 220' in the encapsulant 260. Accordingly, the tie bar 220 or 220' connects to a portion of the dummy finger 221 or 221' except for an external end of the dummy finger 221 or 221'. Therein, the external end is the other end of a finger away from the bonding pads 242 of the chip 240.

As shown in FIG. 7 and FIG. 8, the die-attaching layer, 230 is formed on the bottom surfaces of the bonding fingers 211 and of the dummy finger 221 to connect the fingers 211 and 221. The die-attaching layer 230 is attached to the active surface 241 of the chip 240. The die-attaching layer 230 is a double-side adhesive PI tape in strips or a B-stage adhesive film which is pre-printed on the active surface 241 of the chip 240 then attached to the bottom surfaces of the bonding fingers 211 and of the dummy finger 221.

As shown in FIG. 4 and FIG. 7, the bonding pads 242 of the chip 240 are disposed on the active surface 241 where the die-attaching layer 230 is attached to the active surface 241 so that the bonding fingers 211 and the dummy finger 221 are located on top of the active surface 241, moreover, the dummy finger 221 are adjacent to the first edge 243 of the active surface 241, the tie bar 220 extends through the first edge 243 and connect to a portion of the dummy finger 221 except for an external end of the dummy finger 221, as shown in FIG. 7. To be more specific, the bonding pads 242 are central pads where the bonding pads 242 are the electrical terminals of the chip 240 for wire bonding of bonding wires 250. The linear arranging direction of the dummy finger 221 and the bonding fingers 211 is perpendicular to the first edge 243 of the active surface 241 adjacent to the dummy finger 221. As shown in FIG. 6 and FIG. 7, preferably, the active surface 241 further has a second edge 244 perpendicular to the first edge 243 where the leads 210 extend through the first edge 243 and the second edge 244 and connect to the external ends of the bonding fingers 211 so that the tie bar 220 will not interfere the layout of the leads 210. As shown in FIG. 6, preferably, the tie bar 220 has a wandering portion 222 like a S-shape located outside the active surface 241 in a manner that the tie bar 220 is elastic to reduce the delamination possibility of the dummy finger 221 due to stresses. As shown in FIG. 6 and FIG. 8, the bonding wires 250 connect the bonding pads 242 to the top surfaces of the bonding fingers 211 to electrically connect the chip 240 with the leads 210.

As shown in FIG. 4 and FIG. 8, the encapsulant 260 encapsulates parts of the leads 210 including the bonding fingers 211, the tie bar 220 including the dummy finger 221, the die-attaching layer 230, the chip 240, and the bonding wires 250 to avoid external contaminations. In the present embodiment, the encapsulant 260 is formed by transfer molding.

Therefore, the delamination of bonding fingers 211 located on the active surface 211 of the chip 240 can be eliminated by implementation of the layout and the connections of the dummy finger 221 to bear the concentrated stresses leading to better product reliability of the LOC semiconductor package 200. Moreover, the wandering portion 222 of the tie bar 220 will absorb the stresses so that the dummy finger 221 is not easy to shift nor tilt when experienced thermal stresses to reduce the delamination possibility of the dummy finger. Furthermore, the electrical functions of the LOC semiconductor package 200 will not be impacted by the delamination or break of the dummy finger 221 when under stresses since the tie bar 220 does not extend outside the encapsulant 260 for external connection.

In the present embodiment, as shown in FIG. 4 and FIG. 6, the LOC semiconductor package 200 further comprises a mold-flow control plate 270 for top and bottom moldflow balance. The mold-flow control plate 270 is integrally connected to the tie bar 220, and further connected to the chip 240 through the dummy finger 221 and the die-attaching layer 230 to avoid shifting or tilting of the non-constrained end of the mold-flow control plate 270. That is to say, the mold-flow control plate 270, the tie bar 220 and the leads 210 are formed from the same leadframe (as shown in FIG. 5) and made of the same metal material. The tie bar 220 is firmly held to the chip 240 by the die-attaching layer 230 so that the mold-flow control plate 270 does not need to integrally connect to the leads 210 to avoid direct stress transmission to the leads 210. Moreover, the tie bar 220 further has a first downset bending portion 271 formed between the wandering portion 222 and the mold-flow control plate 270 so that the vertical plane of the mold-flow control plate 270 can be adjusted to differ from the leads 210. Normally, the mold-flow control plate 270 is located on a central and horizontal plane parallel to top and bottom surfaces of the encapsulant 260. Accordingly, the top and the bottom mold flows can be balanced. Additionally, there is no need to downset the leads. The "downset bending" means bending a part of a leadframe to form on a different horizontal plane. To be more specific, the leadframe further has a second downset bending portion 272 between the mold-flow control plate 270 and a dam bar of the leadframe as shown in FIG. 5) so that the mold-flow control plate 270 is horizontally downset adjacent to the central horizontal plane between the top surface and the bottom surface of the encapsulant 260 to well balance the top and the bottom mold flows. Furthermore, since both ends of the mold-flow control plate 270 are connected to the tie bar 220 and to the dam bar of the leadframe respectively, the deformation of the mold-flow control plate 270 by the mold flow during molding can be avoided.

The above description of embodiments of this invention is intended to be illustrative and not limiting. Other embodiments of this invention will be obvious to those skilled in the art in view of the above disclosure.

What is claimed is:

1. A LOC semiconductor package primarily comprising:
   a plurality of leadframe's leads, each having a bonding finger;
   at least a tie bar having a dummy finger, wherein the dummy finger is disposed at one side of the disposition area of the bonding fingers, wherein the bonding fingers and the dummy finger are linearly arranged in parallel;
   a die-attaching layer connecting the bonding fingers and of the dummy finger;
   a chip having an active surface and a plurality of bonding pads disposed on the active surface, wherein the die-attaching layer is attached to the active surface so that the bonding fingers and the dummy finger are located above the active surface, and the dummy finger is adjacent to a first edge of the active surface;
   a plurality of bonding wires electrically connecting the bonding pads to the bonding fingers; and
   an encapsulant encapsulating parts of the leads including the bonding fingers, the tie bar, the die-attaching layer, the chip, and the bonding wires.

2. The LOC semiconductor package as claimed in claim 1, wherein each lead has an external lead extending outside the encapsulant but the tie bar does not extend outside the encapsulant.

3. The LOC semiconductor package as claimed in claim 1, wherein the tie bar has a wandering portion located outside the active surface in a manner that the tie bar is elastic.

4. The LOC semiconductor package as claimed in claim 3, further comprising a mold-flow control plate integrally connected with the tie bar.

5. The LOC semiconductor package as claimed in claim 4, wherein the tie bar further has a downset bending portion formed between the wandering portion and the mold-flow control plate, wherein the encapsulated parts of the leads and the dummy finger are coplanar.

6. The LOC semiconductor package as claimed in claim 1, wherein the active surface further has a second edge perpendicular to the first edge, wherein the tie bar extends through the first edge and connects to a portion of the dummy finger except for an external end of the dummy finger, wherein the leads extend through the first edge and the second edge and connect to a plurality of external ends of the bonding fingers.

7. The LOC semiconductor package as claimed in claim 6, wherein the tie bar is L-shaped connected to an internal end of the dummy finger.

8. The LOC semiconductor package as claimed in claim 6, wherein the tie bar is T-shaped connected to a middle portion of the dummy finger.

9. The LOC semiconductor package as claimed in claim 1, further comprising a redundant finger integrally connected with one of the leads adjacent to the dummy finger through a same lead, wherein the redundant finger is disposed between the connected bonding finger and the dummy finger.

10. The LOC semiconductor package as claimed in claim 9, wherein the redundant finger is U-shaped connected to the bonding finger.

11. The LOC semiconductor package as claimed in claim 1, wherein the linear arranging direction of the dummy finger and the bonding fingers is perpendicular to the first edge of the active surface.

12. A leadframe for a LOC semiconductor package, primarily comprising:
    a plurality of leadframe's leads, each having a bonding finger;
    at least a tie bar having a dummy finger wherein the dummy finger is disposed at one side of the disposition area of the bonding fingers, wherein the bonding fingers and the dummy finger are linearly arranged in parallel; and
    a die-attaching layer connecting the bonding fingers and of the dummy finger, wherein the bonding fingers and the dummy finger are located inside a die-attaching area with the dummy finger adjacent to a first edge of the die-attaching area.

13. The leadframe as claimed in claim 12, wherein the tie bar has a wandering portion located outside the die-attaching area in a manner that the tie bar is elastic.

14. The leadframe as claimed in claim 13, further comprising a mold-flow control plate integrally connected with the tie bar.

15. The leadframe as claimed in claim 14, wherein the tie bar further has a downset bending portion formed between the wandering portion and the mold-flow control plate.

16. The leadframe as claimed in claim 12, wherein the die-attaching area further has a second edge perpendicular to the first edge, wherein the tie bar extends through the first edge and connects to a portion of the dummy finger except for an external end of the dummy finger, wherein the leads extend through the first edge and the second edge and connect to a plurality of external ends of the bonding fingers.

17. The leadframe as claimed in claim 16, wherein the tie bar is L-shaped connected to an internal end of the dummy finger.

18. The leadframe as claimed in claim 16, wherein the tie bar is T-shaped connected to a middle portion of the dummy finger.

19. The leadframe as claimed in claim 12, further comprising a redundant finger integrally connected with one of the leads adjacent to the dummy finger through a same lead, wherein the redundant finger is disposed between the connected bonding finger and the dummy finger.

20. The leadframe as claimed in claim 19, wherein the redundant finger is U-shaped connected to the bonding finger.

* * * * *